(12) United States Patent
Ye et al.

(10) Patent No.: US 9,583,476 B2
(45) Date of Patent: *Feb. 28, 2017

(54) MICROELECTRONIC DEVICE PACKAGES, STACKED MICROELECTRONIC DEVICE PACKAGES, AND METHODS FOR MANUFACTURING MICROELECTRONIC DEVICES

(71) Applicant: Micron Technology, Inc., Boise, ID (US)

(72) Inventors: Seng Kim Dalson Ye, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/050,231

(22) Filed: Feb. 22, 2016

(65) Prior Publication Data

US 2016/0172349 A1    Jun. 16, 2016

Related U.S. Application Data

(60) Division of application No. 14/011,138, filed on Aug. 27, 2013, now Pat. No. 9,299,684, which is a division
(Continued)

(30) Foreign Application Priority Data

Aug. 26, 2005    (SG) .................................. 2005-5523-1

(51) Int. Cl.
*H01L 25/04* (2014.01)
*H01L 25/065* (2006.01)
(Continued)

(52) U.S. Cl.
CPC ............ *H01L 25/50* (2013.01); *H01L 21/563* (2013.01); *H01L 23/13* (2013.01);
(Continued)

(58) Field of Classification Search
CPC . H01L 25/043; H01L 25/0657; H01L 25/074; H01L 25/0756; H01L 25/117; H01L 25/50
See application file for complete search history.

(56) References Cited

U.S. PATENT DOCUMENTS

| | | |
|---|---|---|
| 729,110 A | 5/1903 | Young |
| 5,128,831 A | 7/1992 | Fox, III et al. |

(Continued)

FOREIGN PATENT DOCUMENTS

| | | |
|---|---|---|
| DE | 10023823 A1 | 12/2001 |
| DE | 10259221 A1 | 7/2004 |

(Continued)

OTHER PUBLICATIONS

Hunter, Lloyd P. (editor), Handbook of Semiconductor Electronics, New York, McGraw-Hill, 1970, Section 9, pp. 9-1 to 9-25.
(Continued)

*Primary Examiner* — David Zarneke
(74) *Attorney, Agent, or Firm* — Perkins Coie LLP

(57) ABSTRACT

A stackable microelectronic package includes a first microelectronic die attached to and electrically connecting with a first substrate. A second microelectronic die is attached to the first die on one side, and to a second substrate on the other side. Electrical connections are made between the first die and the first substrate, between the second die and the second substrate, and between the first and second substrates, e.g., via wire bonding. The electrical connecting elements are advantageously encased in a molding compound. Exposed contacts on the first and/or second sub-
(Continued)

strates, not covered by the molding compound, provide for electrical connections between the package, and another package stacked onto the package. The package may avoid coplanarity factors, can be manufactured using existing equipment, allows for intermediate testing, and can also offer a thinner package height.

16 Claims, 3 Drawing Sheets

Related U.S. Application Data of application No. 13/251,980, filed on Oct. 3, 2011, now Pat. No. 8,519,523, which is a continuation of application No. 12/352,283, filed on Jan. 12, 2009, now Pat. No. 8,030,748, which is a continuation of application No. 11/218,028, filed on Aug. 31, 2005, now Pat. No. 7,504,284.

(51) Int. Cl.
  H01L 25/07      (2006.01)
  H01L 25/075     (2006.01)
  H01L 25/11      (2006.01)
  H01L 25/00      (2006.01)
  H01L 23/13      (2006.01)
  H01L 23/31      (2006.01)
  H01L 23/00      (2006.01)
  H01L 21/56      (2006.01)
  H01L 25/10      (2006.01)

(52) U.S. Cl.
  CPC .......... *H01L 23/3114* (2013.01); *H01L 24/48* (2013.01); *H01L 25/00* (2013.01); *H01L 25/0657* (2013.01); *H01L 25/105* (2013.01); *H01L 25/043* (2013.01); *H01L 25/074* (2013.01); *H01L 25/0756* (2013.01); *H01L 25/10* (2013.01); *H01L 25/117* (2013.01); *H01L 2224/06135* (2013.01); *H01L 2224/06136* (2013.01); *H01L 2224/32145* (2013.01); *H01L 2224/4382* (2013.01); *H01L 2224/4824* (2013.01); *H01L 2224/48227* (2013.01); *H01L 2224/73215* (2013.01); *H01L 2224/73265* (2013.01); *H01L 2225/0651* (2013.01); *H01L 2225/1023* (2013.01); *H01L 2225/1058* (2013.01); *H01L 2225/1088* (2013.01); *H01L 2924/01078* (2013.01); *H01L 2924/14* (2013.01); *H01L 2924/15311* (2013.01); *H01L 2924/15331* (2013.01); *H01L 2924/181* (2013.01); *H01L 2924/1815* (2013.01); *H01L 2924/19107* (2013.01)

(56) References Cited

U.S. PATENT DOCUMENTS

| | | |
|---|---|---|
| 5,252,857 A | 10/1993 | Kane et al. |
| 5,258,330 A | 11/1993 | Khandros et al. |
| 5,518,957 A | 5/1996 | Kim |
| 5,883,426 A | 3/1999 | Tokuno et al. |
| 5,923,954 A | 7/1999 | Cho |
| 5,946,553 A | 8/1999 | Wood et al. |
| 5,986,209 A | 11/1999 | Tandy |
| 5,990,566 A | 11/1999 | Farnworth et al. |
| 6,020,624 A | 2/2000 | Wood et al. |
| 6,020,629 A | 2/2000 | Farnworth et al. |
| 6,028,365 A | 2/2000 | Akram et al. |
| 6,051,878 A | 4/2000 | Akram et al. |
| 6,055,778 A | 5/2000 | Ide et al. |
| 6,060,373 A | 5/2000 | Saitoh |
| 6,072,233 A | 6/2000 | Corisis et al. |
| 6,072,236 A | 6/2000 | Akram et al. |
| 6,175,149 B1 | 1/2001 | Akram |
| 6,212,767 B1 | 4/2001 | Tandy |
| 6,225,689 B1 | 5/2001 | Moden et al. |
| 6,235,554 B1 | 5/2001 | Akram et al. |
| 6,252,299 B1 | 6/2001 | Masuda et al. |
| 6,258,623 B1 | 7/2001 | Moden et al. |
| 6,281,577 B1 | 8/2001 | Oppermann et al. |
| 6,294,831 B1 | 9/2001 | Shishido et al. |
| 6,294,839 B1 | 9/2001 | Mess et al. |
| 6,297,547 B1 | 10/2001 | Akram |
| 6,303,981 B1 | 10/2001 | Moden |
| 6,332,766 B1 | 12/2001 | Thummel |
| 6,418,033 B1 | 7/2002 | Rinne |
| 6,429,528 B1 | 8/2002 | King et al. |
| 6,452,279 B2 | 9/2002 | Shimoda et al. |
| 6,458,617 B1 | 10/2002 | Liao et al. |
| 6,472,736 B1 | 10/2002 | Yeh et al. |
| 6,506,681 B2 | 1/2003 | Grigg et al. |
| 6,518,655 B2 | 2/2003 | Morinaga et al. |
| 6,545,366 B2 | 4/2003 | Michii et al. |
| 6,548,376 B2 | 4/2003 | Jiang |
| 6,552,910 B1 | 4/2003 | Moon et al. |
| 6,558,977 B2 | 5/2003 | Nakaoka et al. |
| 6,560,117 B2 | 5/2003 | Moon et al. |
| 6,566,739 B2 | 5/2003 | Moon et al. |
| 6,582,991 B1 | 6/2003 | Maeda |
| 6,607,937 B1 | 8/2003 | Corisis |
| 6,653,731 B2 | 11/2003 | Kato et al. |
| 6,664,143 B2 | 12/2003 | Zhang |
| 6,724,074 B2 | 4/2004 | Song et al. |
| 6,762,488 B2 | 7/2004 | Maeda et al. |
| 6,836,002 B2 | 12/2004 | Chikawa et al. |
| 6,861,288 B2 | 3/2005 | Shim et al. |
| 6,864,566 B2 | 3/2005 | Choi |
| 6,885,092 B1 | 4/2005 | Sakuma et al. |
| 6,896,760 B1 | 5/2005 | Connell et al. |
| 6,936,499 B2 | 8/2005 | Shibata et al. |
| 6,979,905 B2 | 12/2005 | Nishida et al. |
| 7,022,418 B2 | 4/2006 | Connell et al. |
| 7,026,709 B2 | 4/2006 | Tsai et al. |
| 7,030,501 B2 | 4/2006 | Yoshiba et al. |
| 7,037,751 B2 | 5/2006 | Connell et al. |
| 7,037,756 B1 | 5/2006 | Jiang et al. |
| 7,071,421 B2 | 7/2006 | Heng et al. |
| 7,094,630 B2 | 8/2006 | Tomita et al. |
| 7,148,080 B2 | 12/2006 | Kim et al. |
| 7,205,656 B2 | 4/2007 | Kim et al. |
| 7,268,418 B2 | 9/2007 | Wang |
| 7,276,786 B2 | 10/2007 | Cho et al. |
| 7,298,032 B2 | 11/2007 | Kim et al. |
| 7,298,033 B2 | 11/2007 | Yoo |
| 7,358,600 B1 | 4/2008 | D'Estries et al. |
| 7,391,105 B2 | 6/2008 | Yeom |
| 7,429,786 B2 | 9/2008 | Karnezos et al. |
| 7,429,787 B2 | 9/2008 | Karnezos et al. |
| 7,642,636 B2 | 1/2010 | Park et al. |
| 7,851,119 B2 | 12/2010 | Toshine et al. |
| 7,863,723 B2 | 1/2011 | Oh et al. |
| 8,101,459 B2 | 1/2012 | Derderian |
| 8,143,727 B2 | 3/2012 | Oh et al. |
| 2001/0000053 A1 | 3/2001 | Suh et al. |
| 2002/0027295 A1 | 3/2002 | Kikuma et al. |
| 2002/0149097 A1 | 10/2002 | Lee et al. |
| 2002/0171136 A1 | 11/2002 | Hiraoka et al. |
| 2002/0190391 A1 | 12/2002 | Ichikawa |
| 2003/0015721 A1 | 1/2003 | Slater, Jr. et al. |
| 2003/0124766 A1 | 7/2003 | Kim et al. |
| 2004/0038449 A1 | 2/2004 | Corisis |
| 2004/0159954 A1 | 8/2004 | Hetzel et al. |
| 2004/0178488 A1 | 9/2004 | Bolken et al. |
| 2004/0178508 A1 | 9/2004 | Nishimura et al. |
| 2004/0201087 A1 | 10/2004 | Lee |
| 2005/0001305 A1 | 1/2005 | Kyung |
| 2005/0023657 A1 | 2/2005 | Tsai et al. |
| 2005/0046006 A1 | 3/2005 | Yeom |
| 2005/0054140 A1 | 3/2005 | Kim et al. |
| 2005/0087852 A1 | 4/2005 | Chen et al. |

(56) References Cited

U.S. PATENT DOCUMENTS

| | | |
|---|---|---|
| 2005/0104182 A1 | 5/2005 | Kim |
| 2005/0133932 A1 | 6/2005 | Pohl et al. |
| 2006/0044773 A1 | 3/2006 | Akram et al. |
| 2006/0108676 A1 | 5/2006 | Punzalan et al. |
| 2006/0159947 A1 | 7/2006 | Connell et al. |
| 2006/0172510 A1 | 8/2006 | Connell et al. |
| 2006/0201704 A1 | 9/2006 | Heng et al. |
| 2007/0045796 A1 | 3/2007 | Ye et al. |
| 2007/0045803 A1 | 3/2007 | Ye et al. |
| 2007/0045862 A1 | 3/2007 | Corisis et al. |
| 2007/0181989 A1 | 8/2007 | Corisis et al. |
| 2008/0012110 A1 | 1/2008 | Chong et al. |
| 2008/0179729 A1 | 7/2008 | Shim et al. |
| 2008/0217767 A1 | 9/2008 | Tago |
| 2009/0127689 A1 | 5/2009 | Ye et al. |
| 2009/0160065 A1 | 6/2009 | Haba et al. |
| 2010/0065949 A1 | 3/2010 | Thies et al. |
| 2011/0049694 A1 | 3/2011 | Chandrasekaran et al. |
| 2011/0049695 A1 | 3/2011 | Shin et al. |
| 2012/0018887 A1 | 1/2012 | Ye et al. |

FOREIGN PATENT DOCUMENTS

| | | |
|---|---|---|
| DE | 10339890 | 3/2005 |
| EP | 1560267 | 8/2005 |
| JP | 02089852 U | 7/1990 |
| JP | 03159146 A | 7/1991 |
| JP | 02005553 A | 1/1999 |
| JP | 2000228468 A | 8/2000 |
| JP | 200386733 A | 3/2003 |
| JP | 2004172157 A | 6/2004 |
| JP | 2005150719 A | 6/2005 |
| TW | 236744 B | 7/2005 |
| WO | 2004027823 A2 | 4/2004 |
| WO | 2004088727 | 10/2004 |
| WO | 2005059967 A2 | 6/2005 |

OTHER PUBLICATIONS

Office Action (translation) issued Oct. 1, 2008 in Taiwan Application No. 095131626.
Office Action issued Apr. 3, 2012 in Japan Application No. 2008-528182, 6 pages.
Office Action issued Apr. 9, 2013 in Japan Application No. 2008-528182, 7 pages.
Office Action issued Feb. 24, 2010 in Korean Application No. 10-2008-7005294.
Office Action issued Feb. 8, 2011 in Japan Application No. 2008-528182, 7 pages.
Search Report and Written Opinion for International Application No. PCT/US2006/033219, 11 pages, Mar. 26, 2007.
Search Report and Written Opinion for Singapore Application No. 200505523-1, 16 pages, Feb. 8, 2007.

MICROELECTRONIC DEVICE PACKAGES, STACKED MICROELECTRONIC DEVICE PACKAGES, AND METHODS FOR MANUFACTURING MICROELECTRONIC DEVICES

CROSS-REFERENCE TO RELATED APPLICATIONS

This application is a divisional of U.S. application Ser. No. 14/011,138, filed Aug. 27, 2013, which is a divisional of U.S. application Ser. No. 13/251,980 filed Oct. 3, 2011, now U.S. Pat. No. 8,519,523, which is a continuation of U.S. application Ser. No. 12/352,283 filed Jan. 12, 2009, now U.S. Pat. No. 8,030,748, which is a continuation of U.S. application Ser. No. 11/218,028 filed Aug. 31, 2005, now U.S. Pat. No. 7,504,284, which claims foreign priority benefits under 35 U.S.C. §119(a)-(d) and 37 C.F.R. §1.55 of Republic of Singapore Application No. 200505523-1 filed Aug. 26, 2005, now Republic of Singapore Patent No. 130066, each of which is incorporated herein by reference in its entirety.

TECHNICAL FIELD

The present invention is related to microelectronic device packages, stacked microelectronic device packages, and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

An individual die can be packaged by electrically coupling the bond-pads on the die to arrays of pins, ball-pads, or other types of electrical terminals, and then encapsulating the die in a molding compound to protect it from environmental factors (e.g., moisture, particulates, static electricity, and physical impact), and to form a microelectronic device package. In one application, the bond-pads are electrically connected to contacts on an interposer substrate that has an array of ball-pads.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the surface area or "footprint" of the microelectronic device on a printed circuit board. Reducing the size of the microelectronic device can be difficult because high performance microelectronic devices generally have more bond-pads, which result in larger ball-grid arrays and thus larger footprints. One technique used to increase the density of microelectronic devices within a given footprint is to stack one microelectronic device package on top of another. However, these existing stacked designs may have certain disadvantages. For example, they may require excessive space on the substrates for interconnections, preclude separate quality control testing of the devices, or have other drawbacks.

DETAILED DESCRIPTION OF THE DRAWINGS

Figure 1:
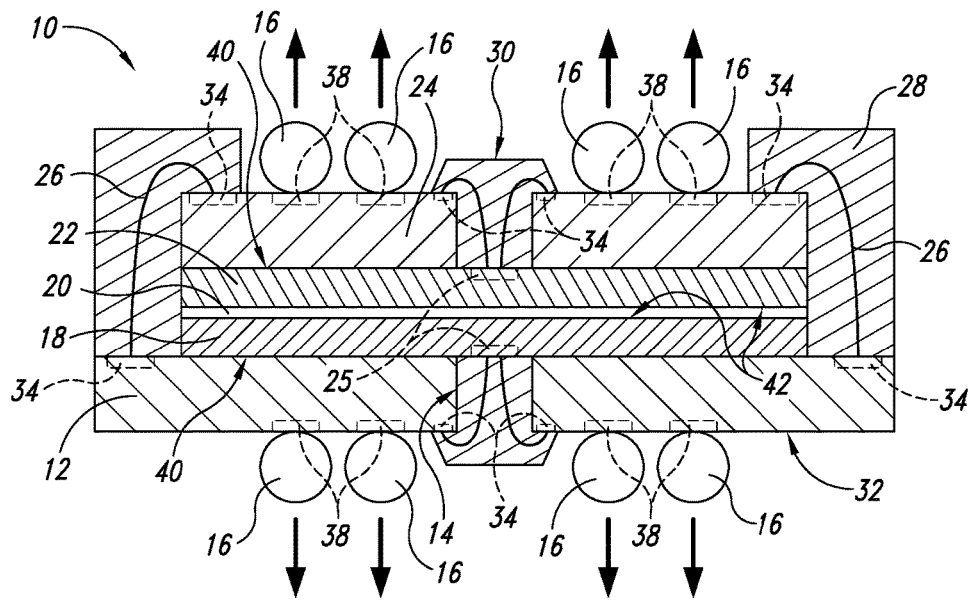
FIG. 1 is a schematic cross-section view of a stackable microelectronic multi-die package.

A microelectronic package advantageously includes two chips or dies in a single package. This provides for a space saving design. A thinner package may also be achieved with certain designs. The package may be designed so that the dies may be separately tested before being placed into a stacked assembly. The dies may optionally be placed back-to-back, to better avoid co-planarity drawbacks. In one embodiment, a microelectronic package has a first microelectronic die electrically connecting with a first substrate, a second substrate electrically connecting with the first substrate, and a second microelectronic die electrically connecting to the second substrate. With designs where the electrical connections are made by wire bonding, one substrate is advantageously bigger than the other substrate.

The microelectronic package may be stacked or attached to another or a second microelectronic package, to form a stacked assembly. Electrical connections may be made between the two microelectronic package assemblies, by electrically connecting or linking contacts on a first substrate of one microelectronic package with contacts on a second substrate of the other microelectronic package. The stacked package can be attached to a circuit board, with electrical connections to the circuit board made through contacts on another substrate of either package.

Many specific details of several embodiments of the invention are described below with reference to forming a plurality of microelectronic devices together in a single assembly, but in other embodiments, each device can be formed separately. Several embodiments in accordance with the invention are set forth in the drawings. The drawings, however, are provided for purpose of illustration only. They are not intended as showing limits on the scope of the invention. The following text is provided to give a thorough understanding of particular embodiments of the invention. A person skilled in the art will understand, however, that the invention may have additional embodiments, or that the invention may be practiced without several of the details described or shown in the drawings.

Turning now to FIG. 1, a stackable microelectronic package 10 has a first substrate 12 having an opening or slot 14.

The opening 14 may advantageously be generally centrally located in the substrate 12. A first microelectronic die or chip 18 has an active side 40 and back side 42. The active side 40 is attached to or adjoining the first substrate 12. The active side 40 of the die 18 has terminals (e.g., bond pads) electrically connecting with contacts on a second side (shown here as the top side) of the substrate 12. The terminals and contacts are typically arranged in an array. The contacts on the substrate 12 generally are electrically connected with other contacts on the first side (shown here as the bottom side) of the substrate 12, to allow the assembly 10 to electrically connect with a circuit board or other higher level assembly.

A second microelectronic die or chip 22 has a back side 42 attached to the back side of the first die 18, preferably with an adhesive 20. This attachment (as well as the other attachments described here) may be direct or indirect, i.e., with or without one or more intermediate elements between them. Each die 18 and 22 generally has one or more integrated circuits, shown schematically in dotted lines at 25. A second substrate 24 is attached to the active side 40 of the second die 22.

The first substrate 12 is larger (i.e., wider and/or longer) than the second substrate 24, meaning that as shown in FIG. 1, the first substrate 12 extends out beyond the second substrate 24. Electrical connections are made between the first and second substrates by connecting pads or contacts 34 on the top or second side of the first substrate 12 to pads or contacts 34 on the top or second side of the second substrate 24. These connections may be made via wire bonds 26. Since the contacts 34 on the first substrate are located on areas of the first substrate 12 that extend out beyond the second substrate 24, wire bond connections between them can be made using existing techniques. The pads or contacts 34 and 38 are shown in FIG. 1 in dotted lines, enlarged and out of scale, for illustration purposes.

Electrical connections are made between contacts on the top of the second substrate 24 and terminals on the active side of the second die 22. As shown in FIG. 1, the second substrate 24 has a through opening or slot 14. Wire bonds 26, or other connecting elements, can therefore extend through the opening 14 to make connections between the second substrate 24 and the second die 22. The wire bond sequence for the second die 22 is reversed as compared to the wire bond sequence for the first die 18, so that the pin assignment will be comparable to the ball pin out.

Electrical connections between the first substrate 12 and terminals on the first die 18 may be made in the same way. The package 10 shown in FIG. 1 may be symmetrical from side to side. Although the dies 18 and 22 are shown as having the same width or length, the dies may be the same, or they may be different from each other, electrically and/or mechanically. The substrates 12 and 24 may be printed circuit boards or other types of substrates for carrying the dies, and providing electrical interconnections. The pads 134 on the substrates are typically arranged in arrays to receive an equivalent or corresponding array of electrical couplers (e.g., solder balls or other solder elements). The first die 18 and first substrate 12 form a board-on-chip construction. Similarly, the second die 22 and the second substrate 24 also form a board-on-chip construction.

After the wire bond connections 26 are made, mold compound 28 is applied over the wire bonds 26 in the areas shown in FIG. 1. The wire bonds 26, and the contacts 34 adjacent to inner or outer edges of the substrates, and the terminals on the dies that they connect to, are covered by the mold compound 28. The dies 18 and 22 may be completely enclosed or covered on all sides by the substrates and the mold compound. The lower side of the first substrate 12 advantageously is not covered by the molding compound 28, except at the wire bonds at the opening 14. Exposed contacts 38, located between the wire bond contacts 34 on the second substrate 24, are not covered by the mold compound. This leaves the exposed contacts 38 on the lower side of the first substrate uncovered, for use in making electrical connections with another package stacked onto the package 10.

The package 10 may then be tested, since all of the contacts and terminals are still accessible by test equipment. This allows defective packages to be detected and removed, before any final assembly of the packages into a stacked assembly. The stacked assemblies therefore can be made from known good assembly packages. This increases the yield during manufacture.

In uses where the package 10 is attached to a circuit board or other higher level assembly, the package 10 may be installed as oriented in FIG. 1, i.e., with the first substrate 12 on the circuit board. Electrical connections can then be made between the package 10 and the circuit board via the exposed contacts 38 linking to contacts, pads or terminals on the circuit board. Reflow solder balls 16 may be used to make these connections. Connections to a circuit board may alternatively, or additionally be made via the exposed contacts 38 on the second substrate 24, if no additional package is stacked onto the package 10. If one or more additional packages are stacked onto the package 10, as shown in FIG. 2, then connections to a circuit board may alternately or additionally be made via exposed contacts, if any, on the package at the top of the stack.

Figure 2:
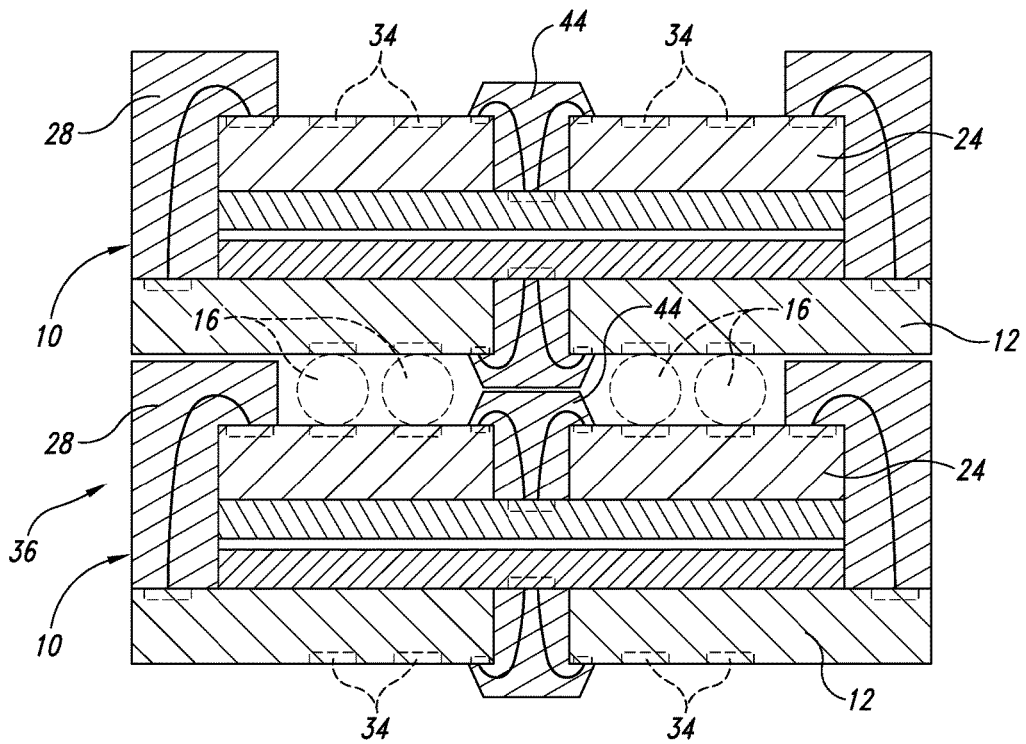
FIG. 2 is a schematic cross-section of two of the packages shown in FIG. 1 attached together to form a stacked assembly.

FIG. 2 shows a second package 10 stacked onto a first package 10. Solder balls or elements 16 may be used on a land grid array, to make electrical connections between the two stacked packages. Mechanical attachment of the packages 10 may be further made with adhesive between the first substrate 12 of the top package and the mold compound 28 on the lower package, and/or between the adjoining mold compound protrusions 44 shown at the center of the stacked assembly 36. The second package may be the same or different from the first package, both electrically and mechanically, so long as any necessary electrical connections between them can be made. While FIG. 2 shows a stacked assembly 36 having two packages 10, of course, the stacked assembly 36 may also have e.g., three, four, five or more packages.

Figure 3:
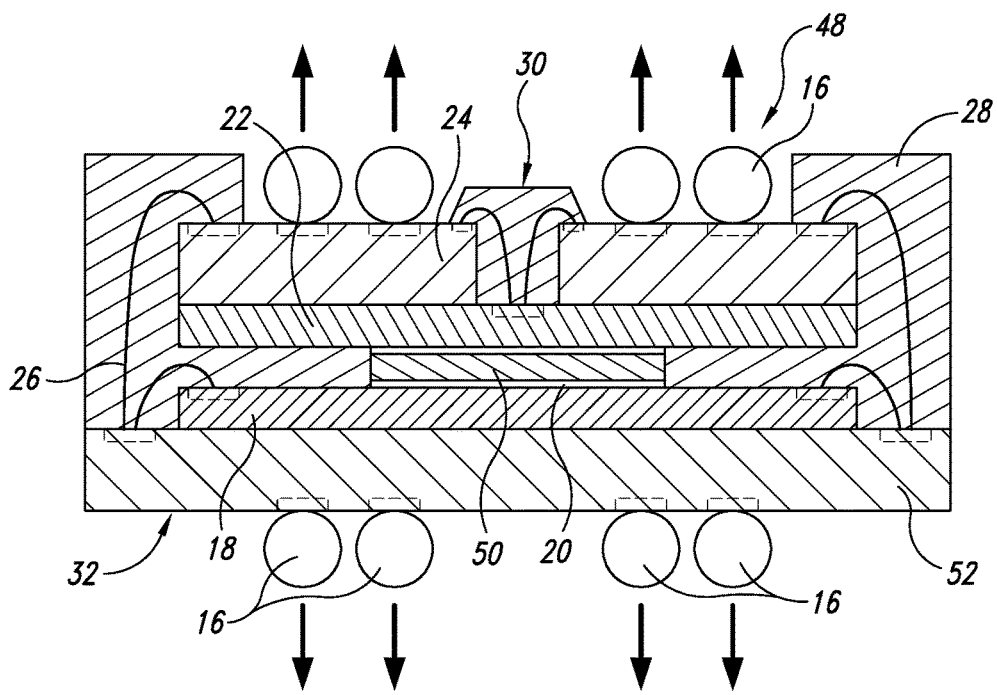
FIG. 3 is a schematic cross-section view of another stackable multi-die package.

FIG. 3 shows another embodiment 48 with a first die 18 on a first substrate 52 forming a chip-on-board construction. Unlike the first substrate 12 shown in FIG. 1, the first substrate 52 in FIG. 3 has no opening or slot. A spacer or epoxy pad 50 is provided on the first die 18. A second die 22 is provided on the spacer 50. The dies may be attached to the spacer via an adhesive 20. A second substrate 24 is attached to the second die 22, forming a board-on-chip construction, similar to the second die and second substrate in FIG. 1. The spacer 50 provides space above the active surface of the first die 18, to allow for wire bonding or similar connections to be made between the first die 18 and the first substrate 52.

If the second die 22 is smaller than the first die 18, the spacer 50 can be omitted, as it is not needed for wire bonding. In this case, the second die 22 may be attached directly to the first die 18, as in FIG. 1. Connections between the first and second dies may be made by peripheral wire bonding from the second substrate bond finger to the first substrate bond finger. The wire bonding or other electrical connections between the second substrate 24 and the second die 22, and between the second substrate 24 and the first substrate 52, as well as the mold compound 28, can be made or used in the same way as in FIG. 1, as described above. The package 48 shown in FIG. 3 may be stacked onto additional other microelectronic packages (which may be the same as or different from the package 48) to form stacked assemblies 36, similar to the concept shown in FIG. 2.

Figure 4:
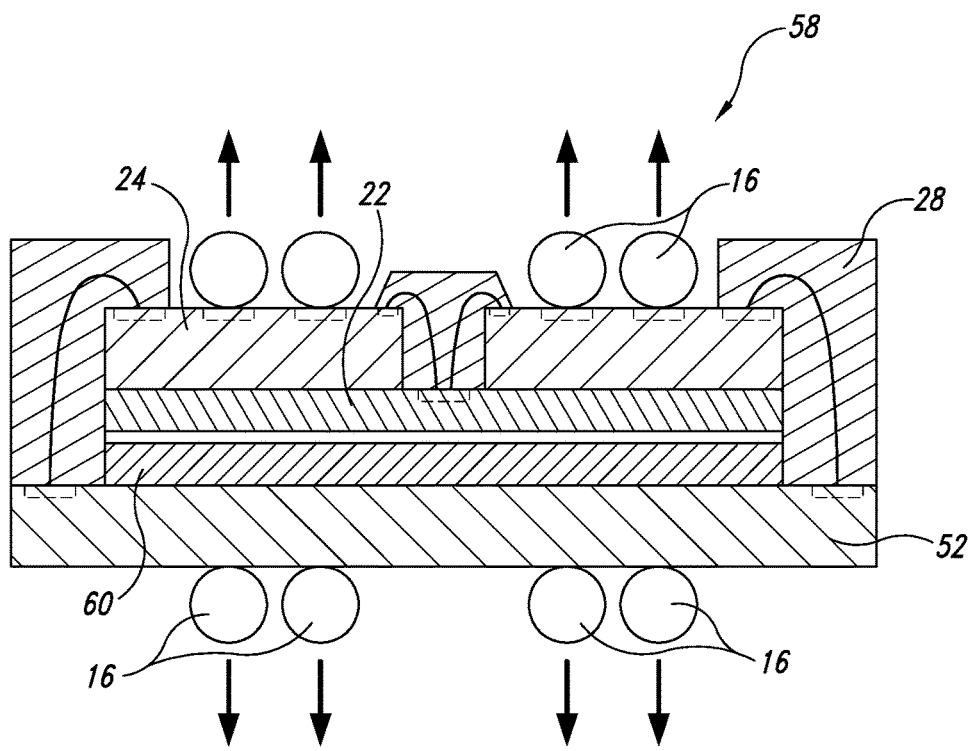
FIG. 4 is a schematic cross-section view of another stackable multi-die package.

FIG. 4 shows another embodiment 58 generally similar to the design shown in FIG. 3, but with the first die 60 in a flip-chip package construction. The first die 60 is attached to the first substrate 52 with the active side down. Electrical connections between the first die 60 and the first substrate 52 are made via conductive bumps or electrical couplers on the down facing active side. The bumps are aligned with, and make contact with, target pads or contacts on the first substrate 52. The back of the second die 22 is attached to the back of the first die 60. A second substrate 24 is attached onto the active side of the second die 22, forming a board-on-chip construction. The electrical connections between the second die 22 and second substrate 24, and between the first substrate 52 and the second substrate 24, as well as the molding compound 28, may be provided in the same way as described above with reference to FIG. 1 or 3. The package 58 may be stacked to form a multiple-package stacked assembly 36, as also described above relative to FIGS. 1-3.

Figure 5:
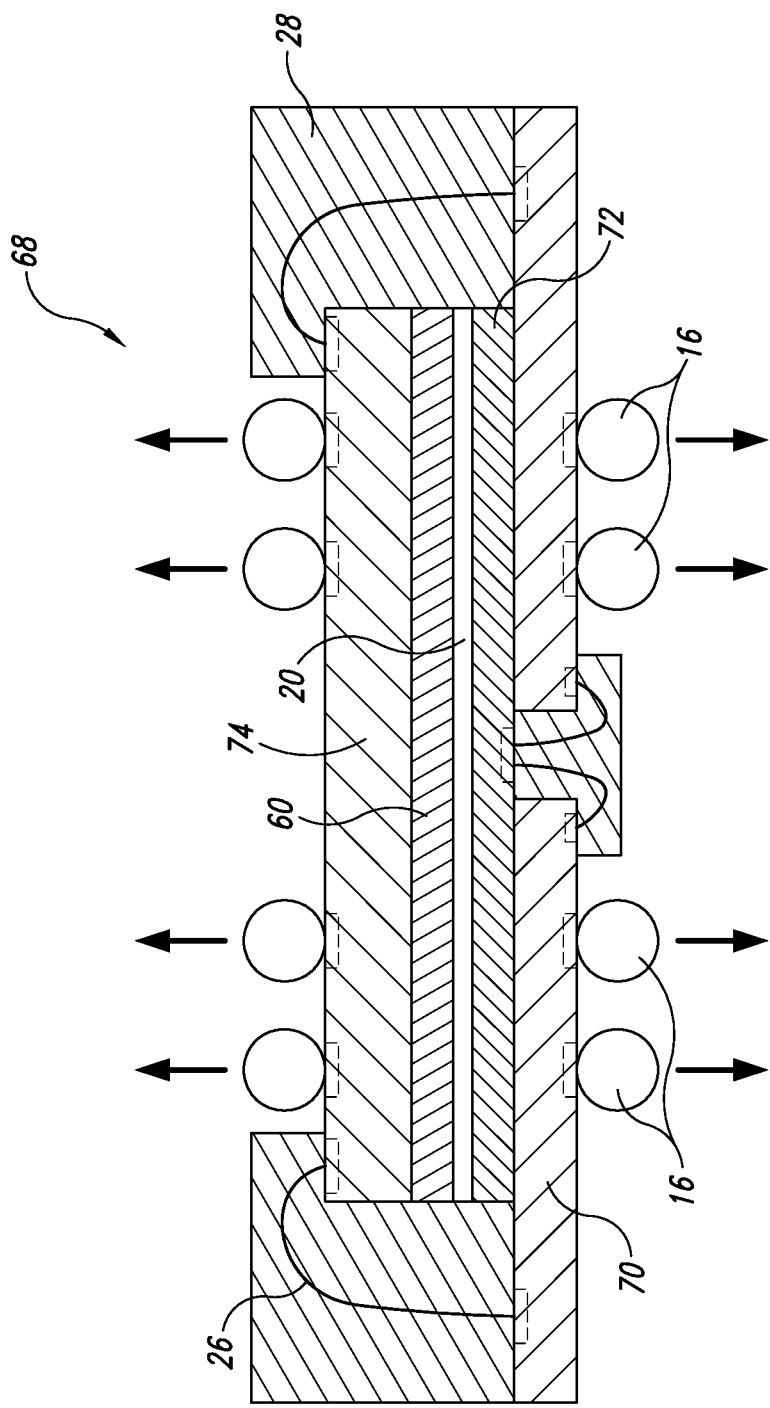
FIG. 5 is a schematic cross-section view of yet another stackable multi-die package.

FIG. 5 shows another embodiment 68 generally similar to the design shown in FIG. 4, but using a flip chip as the second die 60 attached to the smaller substrate 74. A first die 72 is attached to a first substrate 70, in a board-on-chip construction. The second die 60 may be attached back-to-back onto the first die 72 using an adhesive 20. A second substrate 74 is attached to the second die 60. As the second die 60 is a flip chip, electrical connections are made between the second die and the second substrate via bumps on second die, as described above with reference to the first die 60 in FIG. 4. The second substrate 74, which is attached to the second die 60, is smaller than the first substrate 70. Electrical connections between the first and second substrates, and between the first die 72 and the first substrate 70, may be made via wire bonds 26.

The designs described above may provide advantages such as avoiding co-planarity issues (since the dies are back-to-back), allowing for assembly using existing equipment, the first and second substrates can have a ball pin out assignment conforming to industry standards (JEDEC), the components may be individually tested before final assembly, and a thinner package height may be achieved. Of course, practice of the invention in different ways, using different embodiments, may or may not realize each of these advantages. The invention may also be used without necessarily achieving each advantage.

The words pads, contacts, terminals, bumps, electrical couplers, etc. are intended to describe any features, without limitation, that are used in making electrical connections, are not intended to have specific exclusive meanings. The word attached as used here means directly or indirectly joined, adhered, linked, bonded or otherwise supported on. The word substrate here means an element or base to which a die is attached, with a substrate typically, but not exclusively, comprising a circuit board. The word between generally means a direct connection between a first element and second element, as in peripheral wire bonding, but also includes other types of direct or indirect electrical connections.

Thus, several embodiments, and the methods for making them, have been shown and described. Various changes and substitutions may be made without departing from the spirit and scope of the invention. The invention, therefore, should not be limited, except by the following claims, and their equivalents.

The invention claimed is:

1. A method for manufacturing a microelectronic package, comprising:
   attaching a first die to a first substrate having a first external contact facing a first direction, a first wire bond contact facing a second direction opposite the first direction, and wherein the first substrate has a through opening;
   extending wires from a plurality of contacts on the first die through the through opening to contacts facing the first direction;
   attaching a second die to the first die;
   attaching a second substrate to the second die, the second substrate having a second external contact and a second wire bond contact facing the second direction;
   disposing a first wire bond between the first wire bond contact at the first substrate and the second wire bond contact at the second substrate; and
   encapsulating the first and second wire bond contacts and the first wire bond with a molding compound without covering the first external contact or the second external contact.

2. The method of claim 1 wherein attaching a first die to a first substrate includes attaching the first die to the first substrate in a board-on-chip arrangement.

3. The method of claim 1 wherein attaching a first die to a first substrate includes attaching the first die to the first substrate in a flip-chip arrangement.

4. The method of claim 1 further comprising enclosing the wires in a mold compound.

5. The method of claim 1 further comprising excluding the molding compound from areas of the second substrate to leave a grid array of electrical contacts exposed, to allow the microelectronic package to be stacked on another microelectronic package.

6. The method of claim 1 further comprising excluding the molding compound from areas of the first substrate to leave a grid array of electrical contacts exposed, to allow the microelectronic package to be stacked on another microelectronic package.

7. The method of claim 1 further comprising attaching a back surface of the first die to a back surface of the second die via an adhesive.

8. A method for making a stackable multi-electronic package, comprising:
   attaching a first die onto a first substrate, with the first die having electrical couplers physically contacting pads on the first substrate;
   attaching second die on the first die;
   attaching a second substrate on the second die;
   wire bonding first contacts on the first substrate to first contacts on the second substrate; and
   wire-bonding connecting terminals on the second die to second contacts on the second substrate.

9. The method of claim 8 wherein the first contacts on the first substrate are adjacent to an edge of the first substrate, and wherein the first contacts on the second substrate are adjacent to an edge of the second substrate.

10. The method of claim 8 wherein the second contacts on the second substrate are adjacent to an opening in the second substrate.

11. A method for manufacturing a microelectronic package, comprising:

attaching a first die to a first substrate having a first external contact facing a first direction and a first wirebond contact facing a second direction opposite the first direction;
attaching a second die to the first die;
attaching a second substrate to the second die, the second substrate having a second external contact and a second wirebond contact facing the second direction;
disposing a wirebond between the first wirebond contact at the first substrate and the second wirebond contact at the second substrate;
encapsulating the first and second wirebond contacts and the wirebond with a molding compound; and
exposing the first and second external contacts from the molding compound for external connection.

12. The method of claim 11, further comprising:
attaching a first solder ball to the first external contact; and
attaching a second solder ball to the second external contact.

13. The method of claim 11 wherein encapsulating the first and second wirebond contacts includes at least partially encapsulating the first and second substrates and the first and second dies with the molding compound without covering the first external contact or the second external contact.

14. The method of claim 11, further comprising electrically coupling the first die with the first substrate via wirebonding.

15. The method of claim 11 wherein attaching a first die to a first substrate includes attaching the first die to the first substrate in a flip-chip arrangement.

16. The method of claim 11 wherein the first substrate is larger than the second substrate, and wherein disposing a wirebond includes disposing a wirebond between the first wirebond contact and the second wirebond contact, the first wirebond contact being located in an area that extends beyond the second substrate.

* * * * *